US010594412B2

(12) United States Patent
Leaf et al.

(10) Patent No.: US 10,594,412 B2
(45) Date of Patent: Mar. 17, 2020

(54) ANTENNA MONITORING FOR WIRELESS AND TELECOMMUNICATIONS FOR PRIVATE, PUBLIC, AND FIRST RESPONDERS

(71) Applicant: JD Design Enterprises LLC, Sheridan, WY (US)

(72) Inventors: Frederick Daniel Leaf, San Clemente, CA (US); Joshua Travis Helling, Mission Viejo, CA (US)

(73) Assignee: JD Design Enterprises LLC, Sheridan, WY (US)

( * ) Notice: Subject to any disclaimer, the term of this patent is extended or adjusted under 35 U.S.C. 154(b) by 0 days.

(21) Appl. No.: 16/408,921

(22) Filed: May 10, 2019

(65) Prior Publication Data

US 2020/0028600 A1 Jan. 23, 2020

Related U.S. Application Data

(63) Continuation of application No. 16/122,629, filed on Sep. 5, 2018, now Pat. No. 10,291,336.

(Continued)

(51) Int. Cl.
*H04B 17/17* (2015.01)
*H04B 17/16* (2015.01)
*H01Q 21/28* (2006.01)

(52) U.S. Cl.
CPC ............ *H04B 17/17* (2015.01); *H01Q 21/28* (2013.01); *H04B 17/16* (2015.01)

(58) Field of Classification Search
CPC .................................................. H04B 17/17

(Continued)

(56) References Cited

U.S. PATENT DOCUMENTS 6,114,955 A 9/2000 Brunius et al.
6,625,428 B1 9/2003 Finnell et al.
(Continued)

FOREIGN PATENT DOCUMENTS

CN 102232310 A 11/2011
EP 2765721 8/2014
(Continued)

OTHER PUBLICATIONS

NFPA 1221 Standard for the Installation, Maintenance, and Use of Emergency Services and Communication Systems, 2019 edition (2018).

(Continued)

*Primary Examiner* — Lihong Yu
(74) *Attorney, Agent, or Firm* — Knobbe Martens Olson & Bear LLP

(57) ABSTRACT

This disclosure describes example antenna monitoring systems and methods that can include, among other things, a transmitter near each of the antennas in a distributed antenna system (DAS). The transmitter can transmit on a certain frequency or channel corresponding to that antenna, so that the various transmitters in the DAS each transmit on different frequencies. These frequencies can be detected by a receiver and can be processed to determine whether a signal at any frequency or channel expected to be received is missing. If any expected signal is missing for any frequency or channel, the receiver can infer that the antenna or a component associated with the antenna (such as cabling) may have failed. The receiver can then output an indication or notification that may be accessed by maintenance personnel and/or emergency personnel to enable them to identify and repair the non-functioning antenna or component.

22 Claims, 11 Drawing Sheets

Related U.S. Application Data

(60) Provisional application No. 62/699,155, filed on Jul. 17, 2018.

(58) Field of Classification Search
USPC .......................................... 374/224; 375/224
See application file for complete search history.

(56) References Cited

U.S. PATENT DOCUMENTS

| | | | |
|---|---|---|---|
| 7,224,170 | B2 | 5/2007 | Graham et al. |
| 8,254,848 | B1 | 8/2012 | Elliott |
| 8,744,390 | B2 | 6/2014 | Stratford |
| 8,831,592 | B2 | 9/2014 | Elliot et al. |
| 8,831,593 | B2 | 9/2014 | Melester et al. |
| 8,843,174 | B2 | 9/2014 | Abouzid et al. |
| 9,344,174 | B2 | 5/2016 | Ngai et al. |
| 9,894,623 | B2 | 2/2018 | Dussmann et al. |
| 9,900,114 | B2 | 2/2018 | Fourie et al. |
| 10,291,336 | B1* | 5/2019 | Leaf .................. H04B 17/17 |
| 2009/0168677 | A1 | 7/2009 | Kang et al. |
| 2010/0141483 | A1 | 6/2010 | Thacher et al. |
| 2011/0307548 | A1 | 12/2011 | Fisk et al. |
| 2012/0289178 | A1* | 11/2012 | Matsumura ....... H04W 52/0206 455/403 |
| 2012/0322501 | A1* | 12/2012 | Abouzid .................. G01S 5/02 455/552.1 |
| 2014/0269859 | A1 | 9/2014 | Van Hansen |
| 2016/0095068 | A1 | 3/2016 | Henia |
| 2017/0262670 | A1 | 9/2017 | Marchant |
| 2017/0272179 | A1* | 9/2017 | Fourie .................. H04B 17/16 |
| 2017/0373768 | A1 | 12/2017 | Antkowiak et al. |
| 2018/0027430 | A1 | 1/2018 | Pasulka et al. |

FOREIGN PATENT DOCUMENTS

| | | |
|---|---|---|
| WO | WO 2013/009283 | 1/2013 |
| WO | WO 2016/009327 | 1/2016 |
| WO | WO 2016/027256 | 2/2016 |
| WO | WO 2017/197341 | 11/2017 |

OTHER PUBLICATIONS

Invitation to Pay Additional Search Fees issued in PCT/US2019/025018 dated Jul. 15, 2019.

Search Report and Written Opinion issued in PCT/US2019/025018 dated Sep. 9, 2019.

\* cited by examiner

ANTENNA MONITORING FOR WIRELESS AND TELECOMMUNICATIONS FOR PRIVATE, PUBLIC, AND FIRST RESPONDERS

INCORPORATION BY REFERENCE OF RELATED APPLICATION

Any and all applications, if any, for which a foreign or domestic priority claim is identified in the Application Data Sheet of the present application are hereby incorporated by reference under 37 CFR 1.57.

BACKGROUND

Firefighters often use radios within buildings to communicate with one another and with other firefighters outside. These radios typically use line-of-sight transceivers that may not adequately reach all areas of the building. In addition, tint coating on building glass in many modern buildings attenuates or blocks RF signals and thereby prevents reliable communication between firefighters inside and outside the building. Similar problems may be encountered by police and other emergency personnel.

To address these problems, a distributed antenna system (DAS) can be installed in a building. A DAS can include a plurality of antennas that are distributed within a building, which can increase radio coverage for first responders like firefighters, policemen, and emergency medical technicians (EMTs). A DAS used by first responders may be referred to as a public safety DAS or Emergency Responder Radio Communication System (ERRCS). Moreover, a DAS can also be employed for other uses, including extending cellular coverage inside a building. Convention centers, for instance, may employ a DAS for large conventions to enable convention goers to maintain cellular connectivity that would be impossible without the DAS, due to the heavy load on limited cellular resources.

Referring to FIG. 1, an example prior art scenario 100 is shown in which a DAS can be implemented in a building 110. The building 110 includes a donor antenna 102 on the roof. This donor antenna 102 can communicate with external antennas, such as first responder antennas (not shown) or cellular network radio macro towers 108. The donor antenna could also be located on another portion of the building other than the roof, such as the side of the building.

The donor antenna 102 can receive signals from the first responder antennas or cellular network radio macro towers 108. These signals can be transmitted along a wire such as a coaxial cable ("coax") to a bi-directional amplifier (BDA) 130 within the building 110. The donor antenna 102 can also receive signals to be transmitted from the BDA 130 over the coax. The BDA 130 can act as a repeater that amplifies both received and transmitted signals received from or transmitted to the donor antenna 102.

The BDA 130 can supply and receive signals from additional cabling shown in the building 110. This cabling communicates with indoor antennas 160 through coax cables 150 or fiberoptic cables (not shown). The cables connect to the indoor antennas 160 and to the BDA 130 via antenna couplers 140, such as taps or splitters. The indoor antennas 160 can be provided on some or all levels of the building 110.

SUMMARY OF SOME EMBODIMENTS

In various implementations, an antenna system can include: a plurality of antennas distributed throughout a building; a plurality of transmitters, each of the transmitters located in proximity to one of the antennas, such that each of the antennas has one transmitter in proximity thereto; and a receiver having a hardware processor that: receives a plurality of signals from the antennas in the distributed antenna system; identifies a plurality of different frequencies corresponding to the received signals from different ones of the antennas, each of the different frequencies corresponding to one of the antennas; determines that no signal has been received corresponding to an expected one of the frequencies; identifies a first antenna corresponding to the expected frequency; and outputs an indication of a component failure corresponding to the first antenna.

In certain implementations, the system of the preceding paragraph can include any combination of the following features: the system can also include an attenuator that attenuates the plurality of signals; the system can also include a limiter that limits a level of the plurality of signals; at least one of the transmitters can be mechanically attached to one of the antennas; each of the transmitters can be placed within receiving range of one of the antennas but not any of the other antennas; each of the transmitters can include a hardware processor and a network interface, where the network interface can receive instructions from a remote computer system over a network; the transmitters can receive a power cycle instruction to cause the transmitters to restart; the receiver can output the indication of the component failure by outputting the indication of the component failure on a display; the receiver can output the indication of the component failure by outputting the indication of the component failure to a fire alarm control unit; the system can further include outputting the indication of the component failure to an annunciator panel; the receiver can output the indication of the component failure by outputting the indication of the component failure to a fire alarm control unit so as to enable the fire alarm control unit to transmit the indication to a remote monitoring system; the antenna system can support cellular communications within the building; the antenna system can support emergency communications within the building; each of the transmitters can transmit at about −15 dBm; and each of the transmitters can transmit within a range of about 1 to 2 meters, such that each of the transmitters is within about 1 to 2 meters of one of the antennas.

In various implementations, an antenna monitoring method can include (under control of a hardware processor of a receiver in a distributed antenna system): receiving a plurality of signals from antennas in the distributed antenna system; identifying a plurality of frequencies corresponding to the received signals from the antennas, each of the frequencies being a different frequency corresponding to a single one of the antennas; determining that no signal has been received corresponding to an expected one of the frequencies; identifying a first antenna corresponding to the expected frequency; and outputting an indication of a component failure corresponding to the first antenna.

In certain implementations, the method of the preceding paragraph can include any combination of the following features: outputting the indication of the component failure on a display; outputting the indication of the component failure to a fire alarm control unit; outputting the indication of the component failure to an annunciator panel; and outputting the indication of the component failure to a fire alarm control unit so as to enable the fire alarm control unit to transmit the indication to a remote monitoring system.

For purposes of summarizing the disclosure, certain aspects, advantages and novel features of some embodiments are described herein. It is to be understood that not necessarily all such advantages can be achieved in accordance with any particular embodiment disclosed herein. Thus, the embodiments disclosed herein can be embodied or carried out in a manner that achieves or optimizes one advantage or group of advantages as taught herein without necessarily achieving other advantages as may be taught or suggested herein.

BRIEF DESCRIPTION OF THE DRAWINGS

The following drawings and the associated descriptions are provided to illustrate embodiments of the present disclosure and do not limit the scope of the claims.

While the foregoing "Brief Description of the Drawings" references generally various embodiments of the disclosure, such embodiments are not mutually exclusive. Rather, a myriad of combinations of some or all of such embodiments may be implemented.

DETAILED DESCRIPTION

Overview

Figure 1:
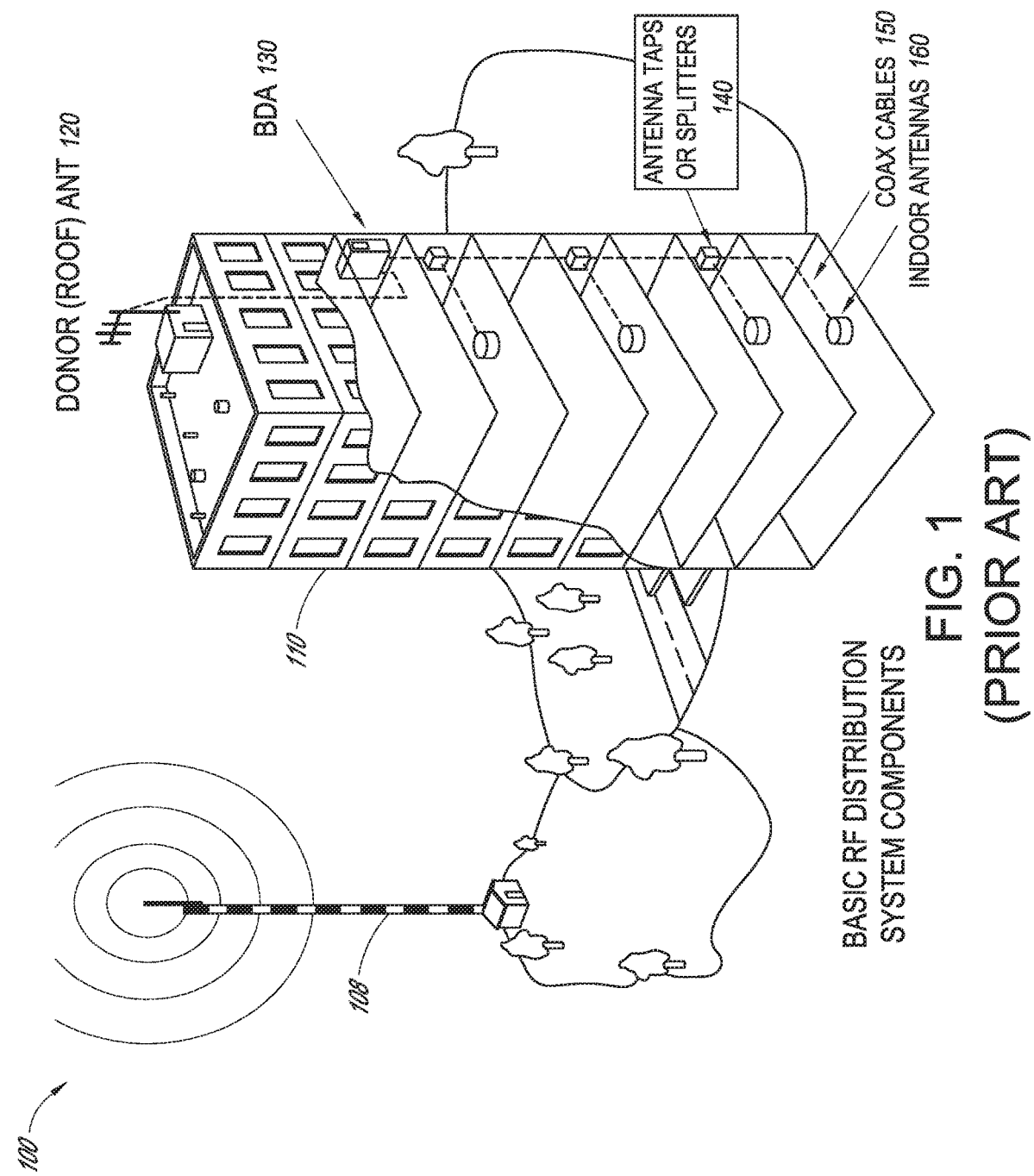
FIG. 1 depicts an example prior art scenario in which a DAS can be implemented in a building.

One problem with a DAS such as shown in FIG. 1 (described above) is that in some buildings, numerous antennas may be distributed throughout the building, such as 50, 100, or more antennas. Some antennas may fail from time to time and stop transmitting or receiving signals. Antenna failure can be due to any of a variety of reasons, including, for example, due to the failure of any component of the antenna or the cabling connecting to the antenna (including from rodent damage). If an antenna failure is undetected, then a first responder may not be able to transmit or receive using that antenna in an emergency. Thus, undetected antenna failure can lead to life-threatening situations for first responders and the people they are attempting to save. Similarly, in the cellular context, it can be desirable to provide users with as much coverage as possible to avoid user complaints and frustration from not being able to access a cellular network and associated data. Not only that, but reduced cellular coverage can limit access to emergency 911 services for cellular users. Thus, antenna failure may inconvenience multiple users.

The National Fire Protection Association (NFPA) has released a standard, NFPA 1221 (2016), which is hereby incorporated by reference in its entirety, and which addresses the installation, maintenance, and use of emergency services communications systems. NFPA 1221 specifies that "[t]ests and inspections shall be made" of communications equipment. NPFA 1221 § 11.1.1. However, testing and monitoring antennas can be difficult because it can be very time consuming to manually check the health status of dozens or hundreds of antennas in a large building. Further, DAS installation companies typically install DAS systems in numerous different venues and thus may not have sufficient employee resources to check antennas frequently. It may be that maintenance personnel may not visit a site for several months or even a few years, and thus a broken antenna may go undetected for a long period of time, cutting the signal off in the area of that antenna.

To attempt to address these problems, this disclosure describes example antenna monitoring systems and methods that can include, among other things, a transmitter for each of the antennas in a DAS. The transmitter can transmit on a certain frequency or channel corresponding to the antenna it is close to, so that the various transmitters in the DAS each transmit on the same or on different frequencies. These frequencies can be detected by a receiver and can be processed to determine whether a signal at any frequency or channel expected to be received is missing.

If any expected signal is missing for any frequency or channel, the receiver can infer that the antenna or a component associated with the antenna (such as cabling) may have failed. The receiver can then output an indication or notification that may be accessed by maintenance personnel and/or emergency personnel to enable them to quickly identify and repair the non-functioning antenna or component. Instead of or in addition to looking for missing signals, the receiver can also detect antennas that are supplying very low signals (for example, below a threshold), which may also constitute a failure of the antenna or component.

Example DAS that Monitors Antenna Functionality

Figure 2:
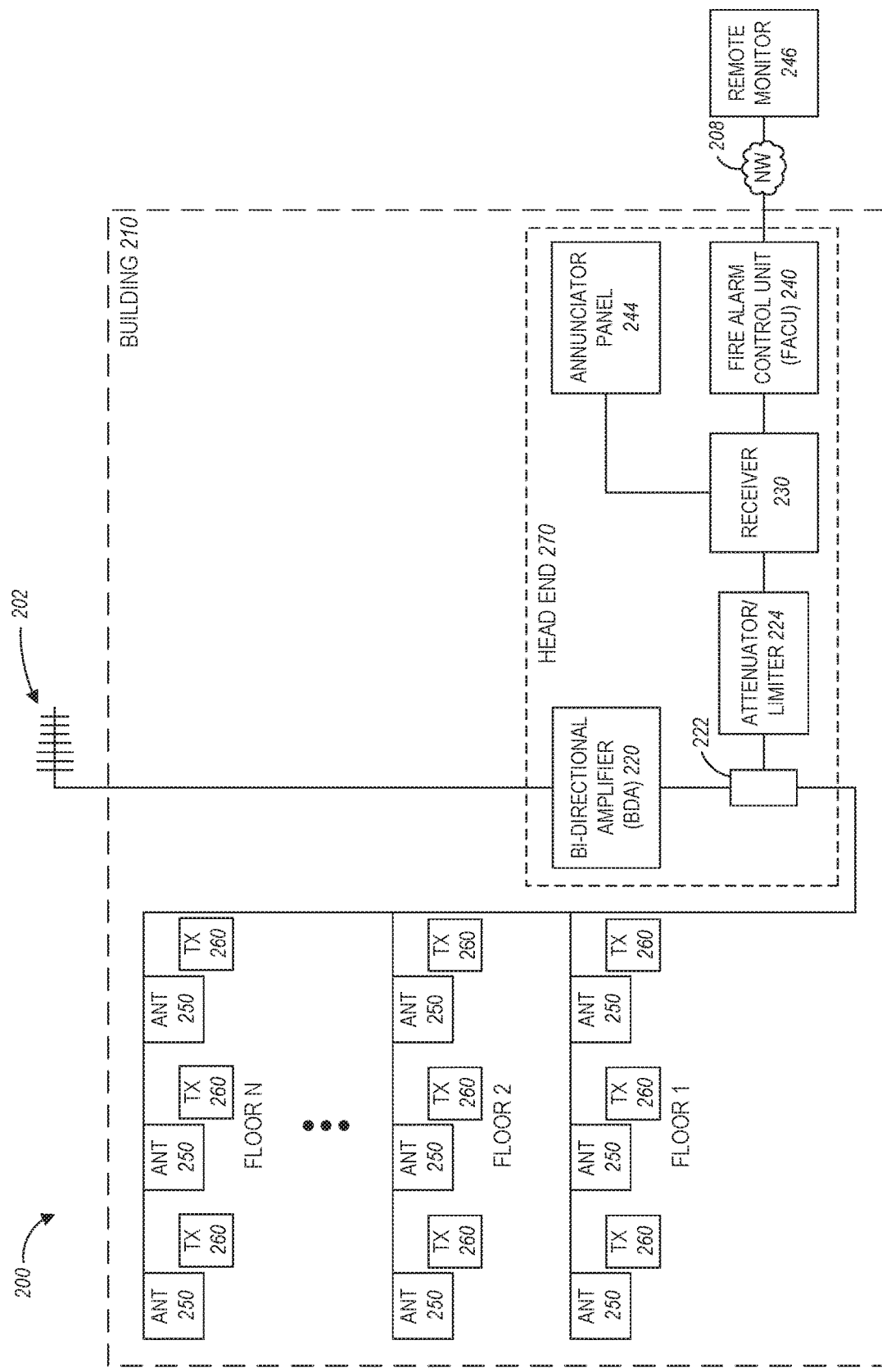
FIG. 2 depicts an example DAS that can monitor antenna functionality.

Turning to FIG. 2, an example DAS 200 is shown that can implement some or all of the features just described. The DAS 200 is shown implemented in a building 210. The DAS 200 can be implemented in any building or venue, including office buildings, hospitals, stadiums, and even outdoors (such as in outdoor malls), and the like, without limitation. The DAS 200 can include antenna monitoring functionality that can detect when an antenna or related component is no longer functioning properly, thereby enabling troubleshooting of the faulty antenna or component and thereby bringing reliable service back online quickly.

In this example, the DAS 200 includes a donor antenna 202 in communication with a bi-directional amplifier (BDA) 220. The BDA 220 is shown in communication with a coupler 222, which may be a tap, splitter, or the like. The coupler 222 is in communication with the plurality of antennas 250 and a head end 270. Each of the antennas 250 can be indoor antennas like the ones described above with respect to FIG. 1. The antennas 250 can also be outdoor antennas (for example, in an outdoor mall). Three antennas 250 are shown on each of three floors; floor 1, floor 2, and floor N. An ellipsis between floor 2 and floor N indicate that any number of floors may be used in the DAS 200. Further, any number of antennas 250, from one to several, may be installed on any given floor in a building 210. The antennas 250 need not be installed on every floor.

In proximity with each antenna 250 is a transmitter 260. Each of the transmitters 260 can include hardware and optionally software that transmits a signal (such as a carrier wave or any other suitable signal) at a specific frequency. The transmitters 260 may operate at a different frequency or channel for each antenna 250. As a result, each antenna 250 can detect and then transmit a signal at a different frequency, making that antenna's output (and thus functioning) readily identifiable by frequency, which can satisfy the NFPA code and meet emergency 911 needs.

Each antenna 250 may be in proximity with its corresponding transmitter 260. An antenna 250 and a transmitter 260 "in proximity," in addition to having its ordinary meaning, can mean, among other things, that the antenna 250 and transmitter 260 can be in contact with or otherwise mechanically attached to each other, or that the antenna 250 and transmitter 260 can be a short distance away from one another (such as within a number of centimeters, within about one meter, or within about two meters), or that the transmitter 260 may be within a receive range of the antenna 250 such that the transmitter 260 can transmit a signal that will be received by the antenna 250 but that will not be received by another antenna 250 within the same building (or that the received signal will be below a threshold at other antennas 250 within the building). Thus, for example, while another antenna 250 in the building may receive a signal from another antenna's 250 transmitter 260, that signal may be at a very low level and possibly below a noise floor. A transmitter 260 can be attached to a wall or junction box near its corresponding antenna 260 in some installations. The transmitter 260 may be within about 1 to 2 meters of the antenna 250 in some installations. The transmitter 260 may also be directly behind the antenna 250. Moreover, the transmitter 260 may be internal to the antenna 250, such that the antenna 250 may be sold with the transmitter 260 integrated therewith.

As described above, the coupler 222 can couple cables, such as coaxial or fiberoptic cables, between the different antennas and the BDA 220. The coupler 220 can also couple the BDA 220 and the antennas 250 to the head end 270. The head end 270 can include a plurality of components that may be in an electrical room of the building 210 or in some other location of the building 210 (such as in a basement or electrical closet). The BDA 220 may be part of the head end 270. The head end 270 can include an attenuator and/or limiter 224, a receiver 230, a fire alarm control unit (FACU) 240, and an annunciator panel 244. Fewer than all of the components shown may be provided in other implementations.

The attenuator/limiter 224 can attenuate and/or limit incoming signal from the coupler 222 to avoid sending too strong of a signal to the receiver 230, which might damage the receiver 230. The receiver 230 can include a processor, memory, and a display. The receiver 230 can receive signals from the antennas 250 through the coupler 220 and the attenuator/limiter 224. The receiver 230 can analyze the signals using the processor to determine whether any of the antennas 250 are not receiving on a specific frequency transmitted by a transmitter 260. If the receiver 230 identifies that a signal at a specific frequency is not received, then the receiver 230 can output an indication of a component failure. The component failure can indicate that an antenna 250 corresponding to that frequency has failed or that some other component associated with that antenna 250 has failed (such as a coupler or cable).

The receiver 230 can output this component failure indication on a display of the receiver 230. Further, the receiver 230 can also output the component failure indication to one or more other devices, including the FACU 240 and the annunciator panel 244. The FACU 240 can control fire alarms in the building and can also include a display that outputs the indication received from the receiver 230. The FACU 240 can also communicate the component failure indication over a network 208 (which may include the Internet, a local area network, a wide area network, or the like) to a remote monitor 246. The remote monitor 246 may be a device (such as a computer or annunciator panel) installed in a fire station or other emergency communications facility. A remote monitor 246 may instead or also be located at a provider facility corresponding to a provider of the DAS 200.

The annunciator panel 244 can also receive an indication of a component failure from the receiver 230 and can output the indication of the failure. This indication may be a lamp, LED, or the like that lights up to indicate that a component has failed (but may or may not indicate which component failed). The annunciator panel 244 may provide firefighters or other emergency personnel a quick, at-a-glance view that a component has failed. The annunciator panel 244 can act as a redundant component to the FACU 240 and may be more reliable than the FACU 240 in the event of a fire or other emergency.

The DAS 200 can be an active DAS or a passive DAS. An active DAS can include fiberoptic cable instead of coax or in conjunction with coax. A passive DAS typically includes coax cable instead of fiberoptic cable. Fiberoptic cable can enable antennas 250 to be dispersed over a wider range, such as in a larger building, due to less line loss than coaxial cable. As an alternative to fiberoptic cables for large venues, multiple BDAs and receivers may be spread throughout a building, connected by coax, so that each BDA and receiver correspond to a subset of the antennas in the building. The multiple receivers can send their indications to a single head end that includes an FACU and an annunciator panel or the like. Many other configurations are also possible.

The receiver 230 can also detect larger-scale failures and report these failures. For instance, if the receiver 230 does not receive expected signals from all antennas 250 on one floor, the receiver 230 can indicate that there may be a problem with a coupler that feeds line to that floor. If the receiver 230 does not receive any expected signals, the receiver 230 may indicate that the coupler 222 or some other major component may have failed.

Although the system shown in FIG. 2 is a DAS, it should be understood that the inventive features described herein are not limited to being implemented in a DAS. Rather, some or all of the features described herein can be implemented in cellular sites, such as radio macro antennas, or in other antenna installations.

Figure 3:
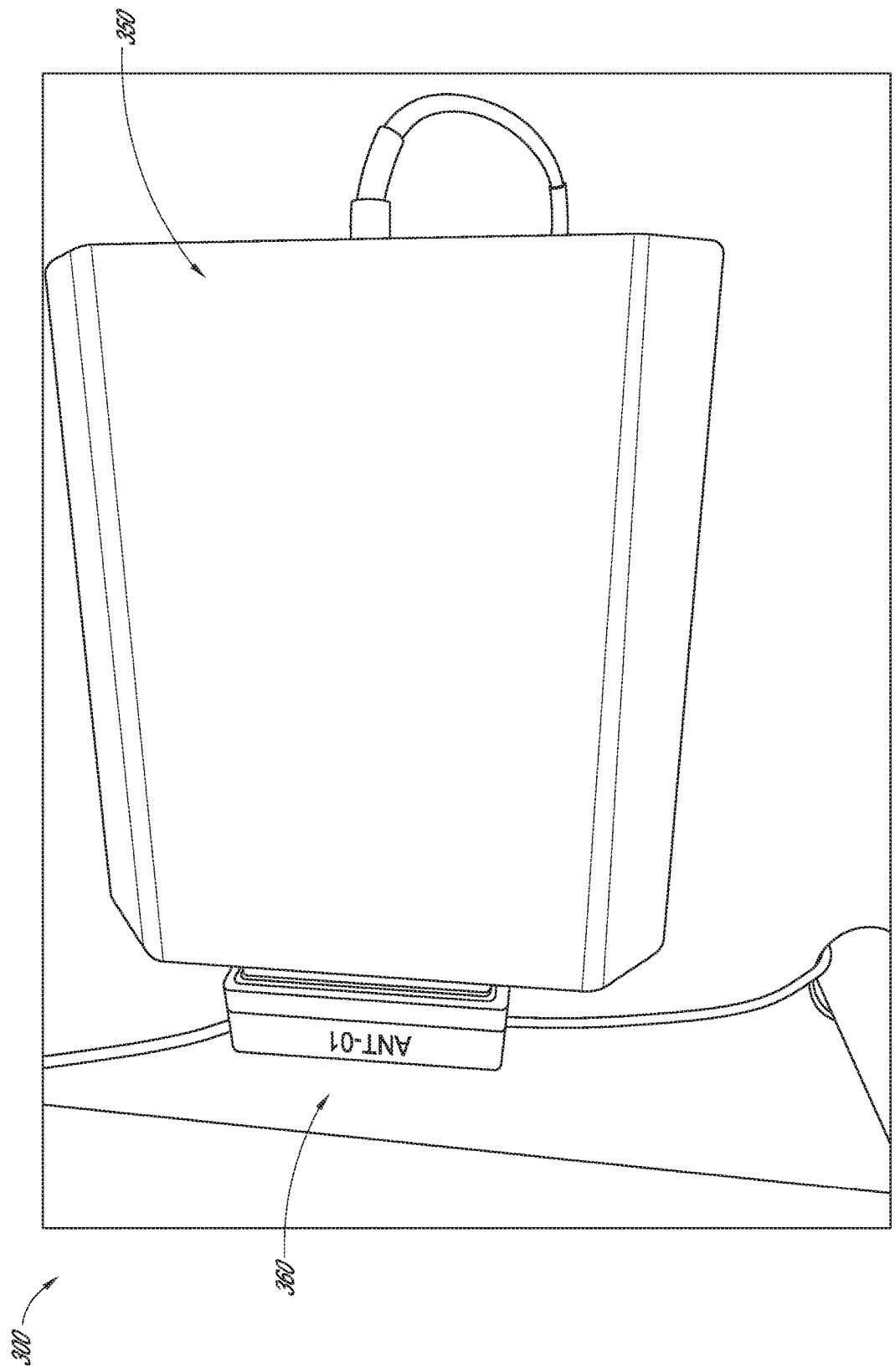
FIG. 3 depicts an example antenna and transmitter installation.

Turning to FIG. 3, an example antenna and transmitter installation 300 is shown. The antenna installation 300 includes an antenna 350, which is an example of the antenna 250 described above with respect to FIG. 2. The antenna installation 300 also includes a transmitter 360, which is an example of the transmitter 260 described above with respect to FIG. 2. The transmitter 360 is shown connected or attached mechanically to the antenna 350 in this example installation 300. In other configurations, as described above, the transmitter 360 need not be connected directly to the antenna 350.

In some implementations, the transmitter 360 transmits at a power that is sufficient to be detected above the noise floor at the antenna 350 but not so high as to create stray currents in the coax connected to the antenna 350. For example, the transmitter 360 can transmit at about −15 dBm (decibels relative to one milliwatt). However, in other implementations, the transmitter 360 can transmit in the range of about −20 dBm to about 0 dBm, or in the range of about −25 dBm to about 5 dBm, or in the range of about −30 dBm to about 20 dBm, or in some other range.

The transmitter 360 may be battery powered. It can be useful to reduce battery consumption of the transmitter 360 because having a transmitter fail 360 can be nearly as significant a problem as an antenna failing 350 (if a transmitter 360 fails, the receiver 230 may indicate that the antenna 350 has failed). To conserve battery, the transmitter 360 can be configured to transmit at a rate that reduces power consumption. For instance, the transmitter 360 can transmit periodically, such as once every few minutes, once every hour, once every day, once every 48 hours, or at some other interval. Current transmitters may have a battery life of about two years. In future antenna implementations, including 5G wireless, which is anticipated to use millimeter wave frequencies, the transmitter 360 can be a millimeter wave transmitter that consumes so little power as to be able to have a battery life of ten years or more. In general, any of the features described herein can be used in a 5G wireless installation, or in subsequent wireless standards.

The transmitter 360 can transmit on any of a variety of frequencies. For instance, the transmitter 360 can transmit on the 900 MHz band (for example, between about 902 MHz and about 928 MHz, or some other range), and the antenna 350 may communicate with public safety radios or cellular radios on the 800 MHz band. However, other frequency bands may be used without limitation, such as any band in the range of 0 Hz to 20 GHz or higher. For example, the transmitter 360 may transmit on frequencies other than the 900 MHz band to avoid interfering with hospital paging systems (if the transmitter 360 is installed in a hospital or other medical facility). More generally, the transmitter 360 can transmit at frequencies in the range of about 0 Hz to 20 GHz or higher. The transmitter 360 may operate on licensed or unlicensed frequencies.

Figure 4:
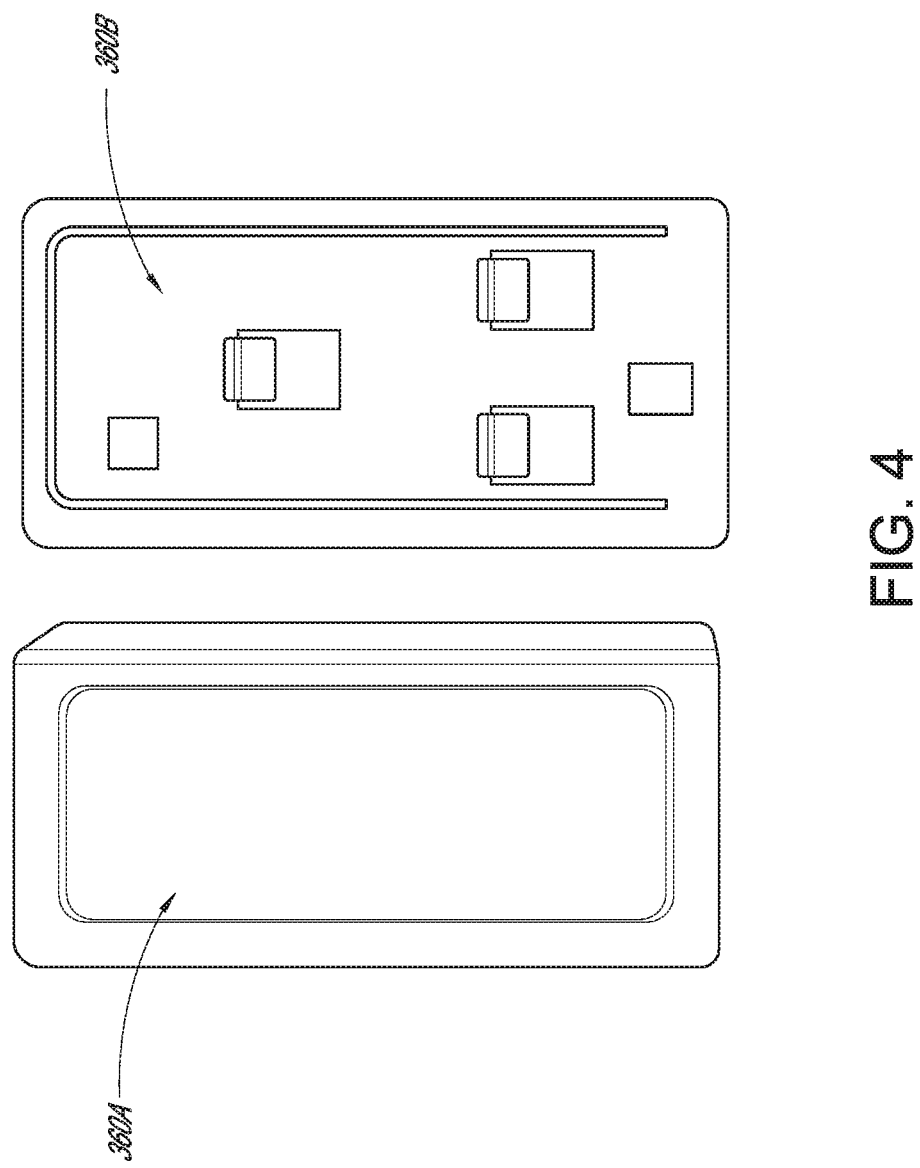
FIG. 4 depicts example views of the transmitter of FIG. 3.

Turning to FIG. 4, two example views of the transmitter 360 are shown, including a front view 360a and a rear view 360b. This transmitter 360 is an example transmitter model number VL965-B7 available from Systems Technologies, Inc. The transmitter 360 can be an off-the-shelf transmitter used typically in nurse call functions in hospitals. These types of transmitters may be good transmitters for this application because they can be battery-operated and can operate in a frequency band that is different from the main operating frequency band of the antenna 250 or 350, so as to reduce interference between the two frequency bands.

Figure 5:
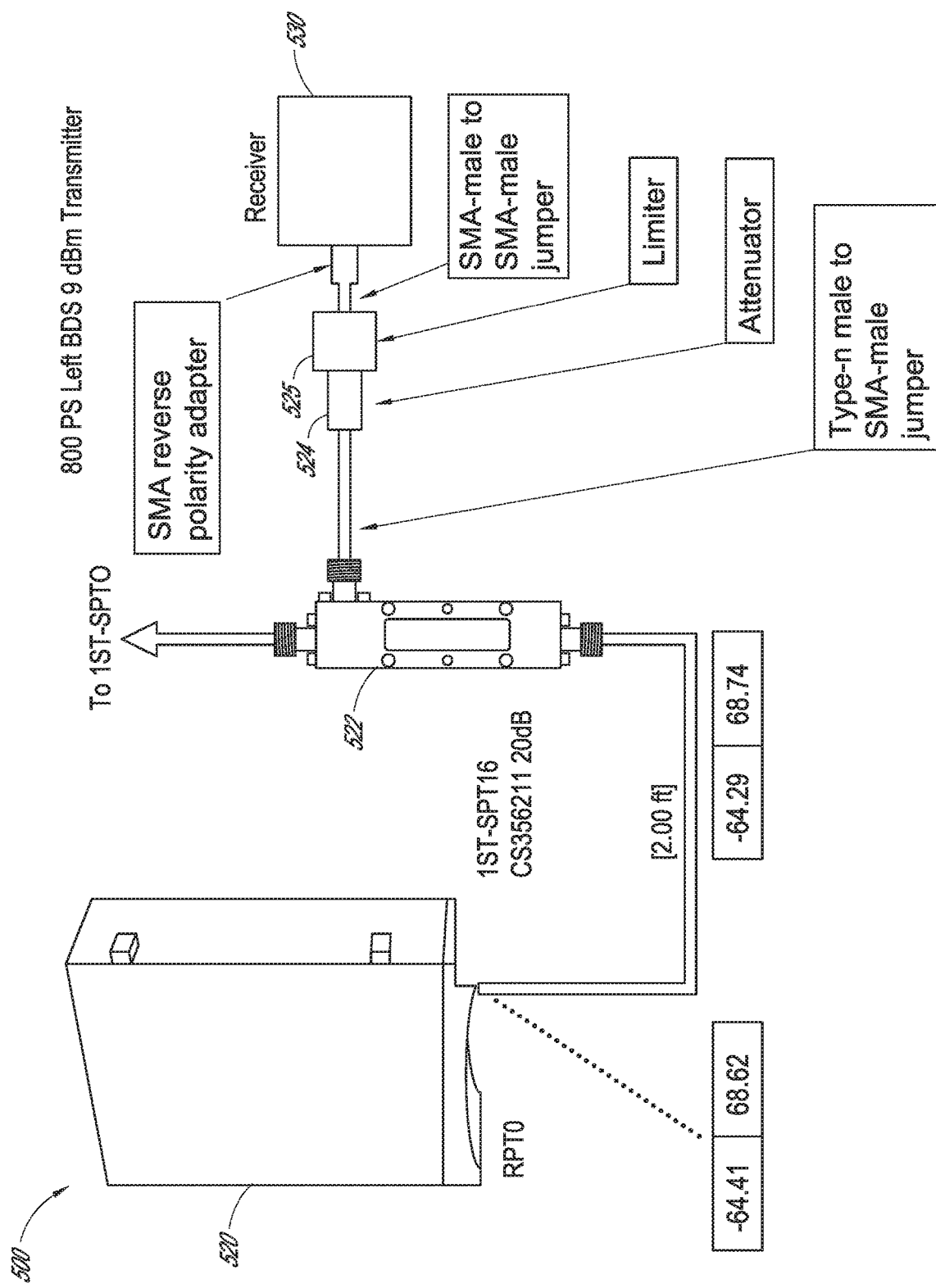
FIG. 5 depicts an example head end of a DAS.

Turning to FIG. 5, an example head end 500 is shown with a BDA 520 that is connected via coax cable to a coupler 522, attenuator 524, limiter 525, and receiver 530. The coupler 522 is connected to a receiver 530 via cabling, an attenuator 524, and a limiter 525. The BDA 520 is an example of the BDA 220 of FIG. 2. Likewise, the coupler 522, the attenuator 524, limiter 525, and receiver 530 are examples of their respective counterparts from FIG. 2.

Example component types are listed in FIG. 5, which may be varied in various embodiments. The coupler 522, for instance, can be a tap that provides unequal signal distribution at the different outputs of the tap to enable an antenna that is farther from the receiver to receive an appropriate amount of signal. Due to signal loss over longer distances, the output of the tap to a more distant antenna may be greater than to a closer antenna. The cable from the upper connection of the coupler 522 can be connected to the antennas 250 through other couplers (see, e.g., FIG. 10). For simplicity, a connection to a donor antenna from the BDA 520 is not shown.

The attenuator 524 can reduce the signal received from the coupler 522 to avoid sending a signal of too high a level to the receiver 530. The limiter 525 can limit the level of the signal to a certain dBm value to attempt to prevent transient spikes from damaging the receiver 530. Example cable lengths are shown as well as example dBm values for inputs and outputs of the different components. These values may be varied in other embodiments.

Figure 6:
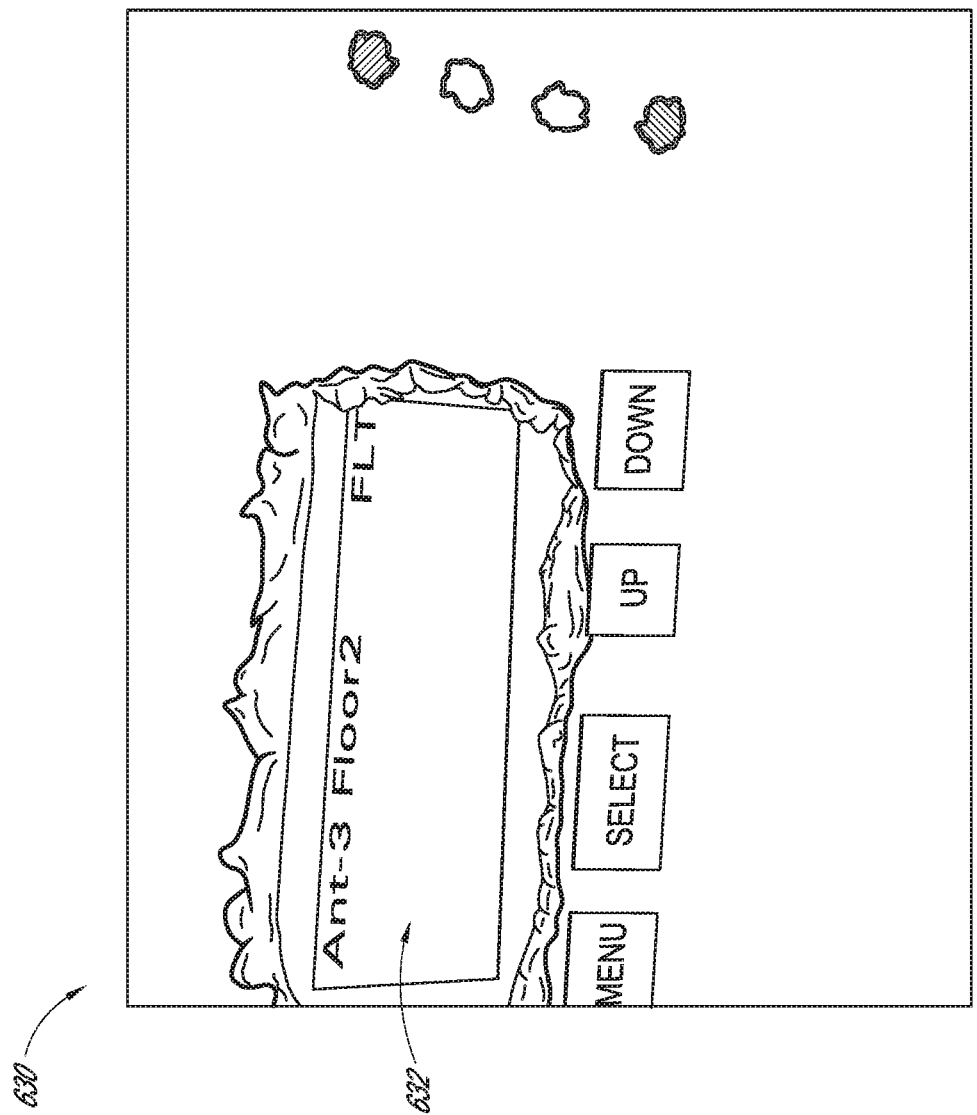
FIG. 6 depicts an example of a front portion of a receiver.

Turning to FIG. 6, an example of a front portion of a receiver 630 is shown. The receiver 630 shown is a model VL400-B7 available from Systems Technologies, Inc. Other types of receivers may be used.

The front portion of the receiver 630 is zoomed in to show a close-up of a display 632 of the receiver. The display 632 includes the text "Ant-3 Floor2 FLT," which can indicate that antenna number 3 on the second floor has a fault. A map of the building may be provided near the receiver 630 for first responders to find where antenna 3, as well as other antennas, are located.

Figure 7:
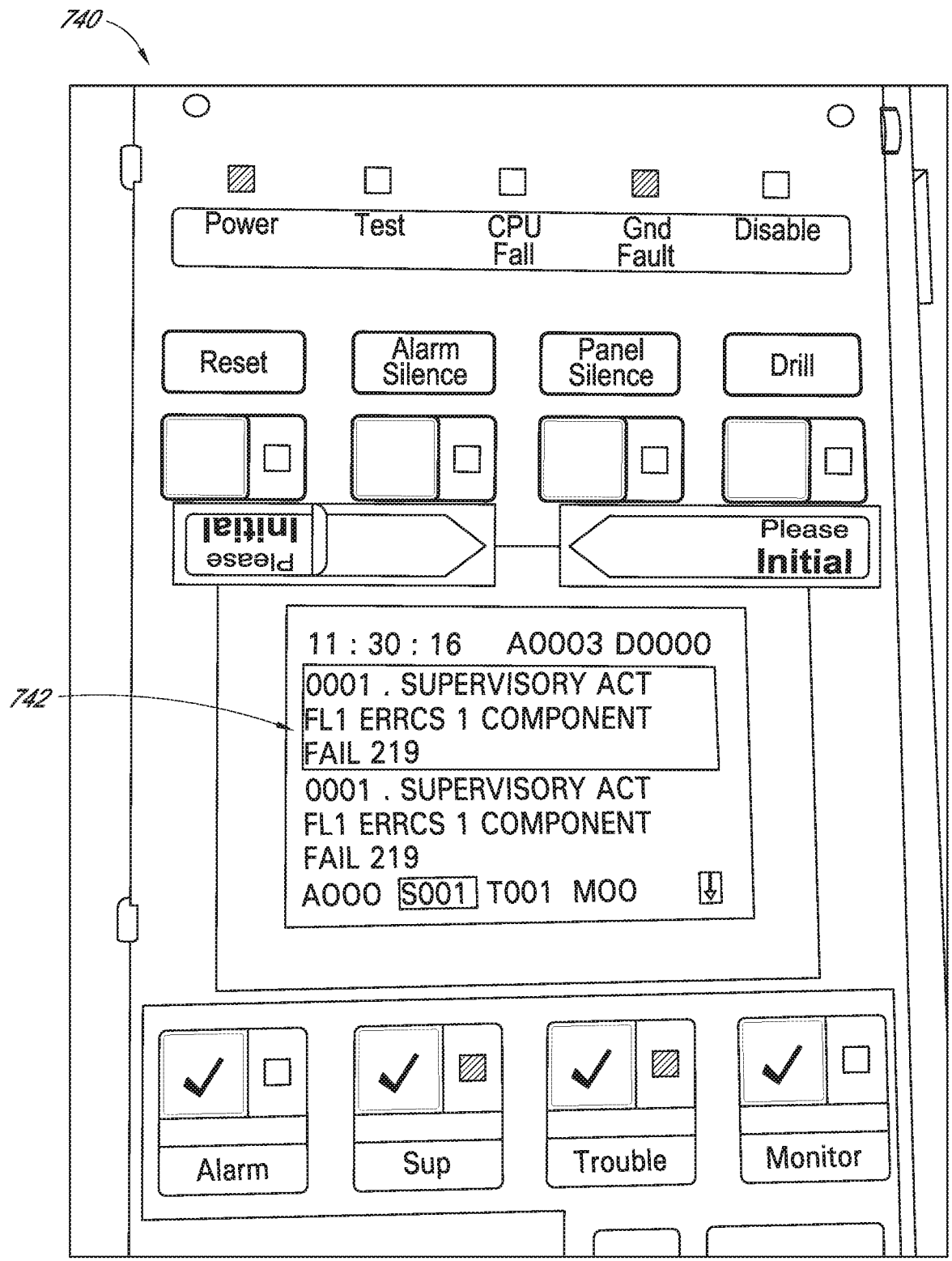
FIG. 7 depicts an example panel of a fire alarm control unit.

Turning to FIG. 7, an example panel of an FACU 740 is shown. The FACU 740 includes a display 742 which also includes information that can be received from the receiver described above, and which includes text that indicates that an ERRCS 1 component failed 219. The ERRCS component refers to an emergency responder radio communications system component, such as an antenna, and the number 219 can refer to a region of the building. The information on the display of the FACU 740 can be transmitted to the remote monitor 246 at the fire department or other emergency communications center, as described above.

Figure 8:
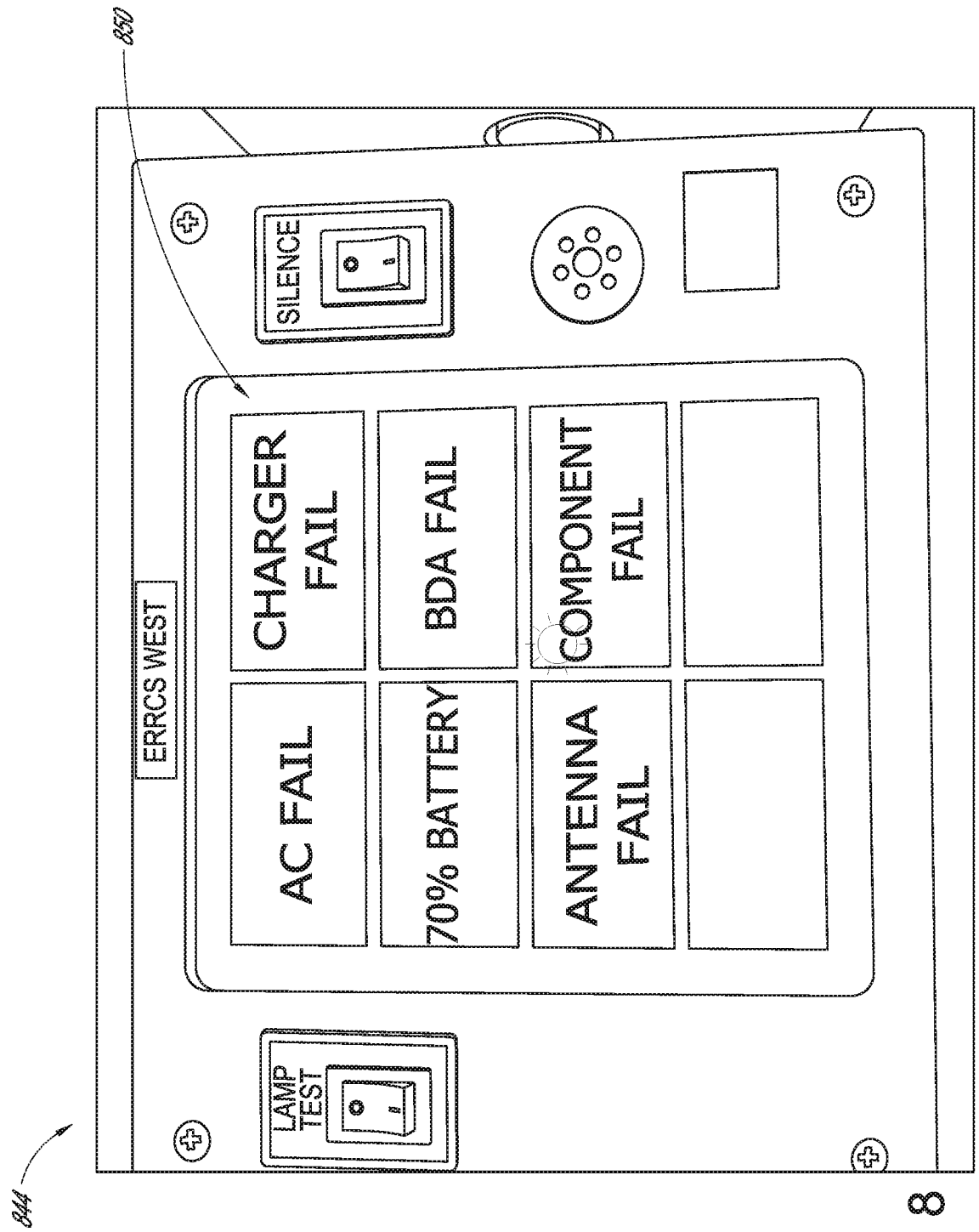
FIG. 8 depicts an example annunciator panel.

Turning to FIG. 8, an example annunciator panel 844 is shown corresponding to the annunciator panel 244 of FIG. 2. The annunciator panel 844 includes lamp areas 850 that are labeled. If a lamp is lit, the condition specified by text 850 corresponding to the lamp has occurred. Thus, in the depicted example, a lamp has indicated that there is a component failure.

Figure 9:
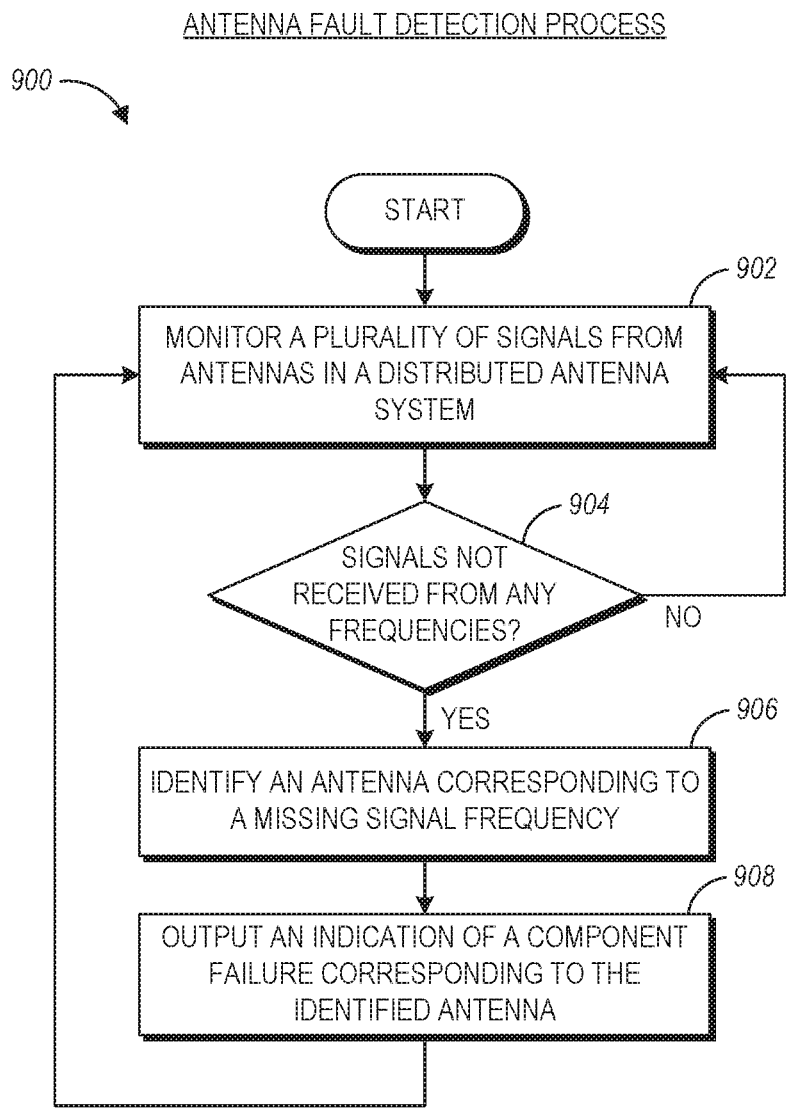
FIG. 9 depicts an example antenna fault detection process.

Turning to FIG. 9, an example antenna fault detection process 900 is shown. The antenna fault detection process 900 can be implemented by any of the receivers described herein. For example, a hardware processor of a receiver may implement the process 900 shown to detect a fault with an antenna or another component corresponding to that antenna.

At block 902, the receiver monitors a plurality of signals from antennas in a distributed antenna system. At decision block 904, if signals are not received from any expected frequencies, then the receiver at block 906 identifies an antenna corresponding to the missing signal frequency and outputs an indication of a component failure corresponding to the identified antenna at block 908. Otherwise, from decision block 904, if signals are received from all expected frequencies, then the process 900 loops back to block 902 where the receiver continues to monitor a plurality of signals from the antennas in the DAS.

In another embodiment, instead of determining whether no signals are received, the process 900 can determine whether an expected signal is below a threshold in signal level. An abnormally low signal level can indicate a problem with an antenna or related component, even if the signal is in fact received. If the signal level corresponding to a particular frequency is too low, the receiver can output an indication of a fault with the antenna or a component corresponding with that antenna.

Figure 10A:
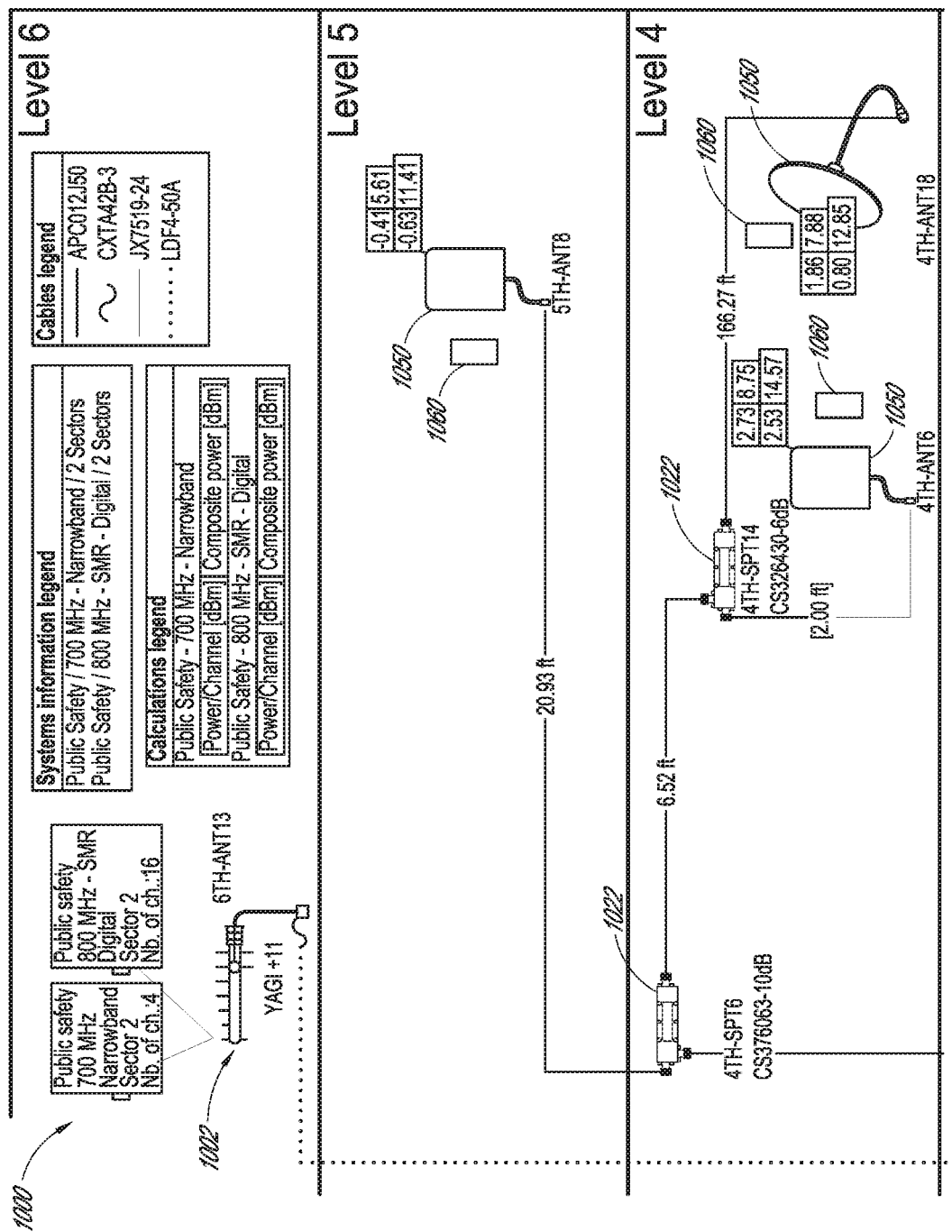
FIG. 10 (split across FIGS. 10A and 10B) depicts a portion of an example DAS installation in an actual building.
Figure 10B:
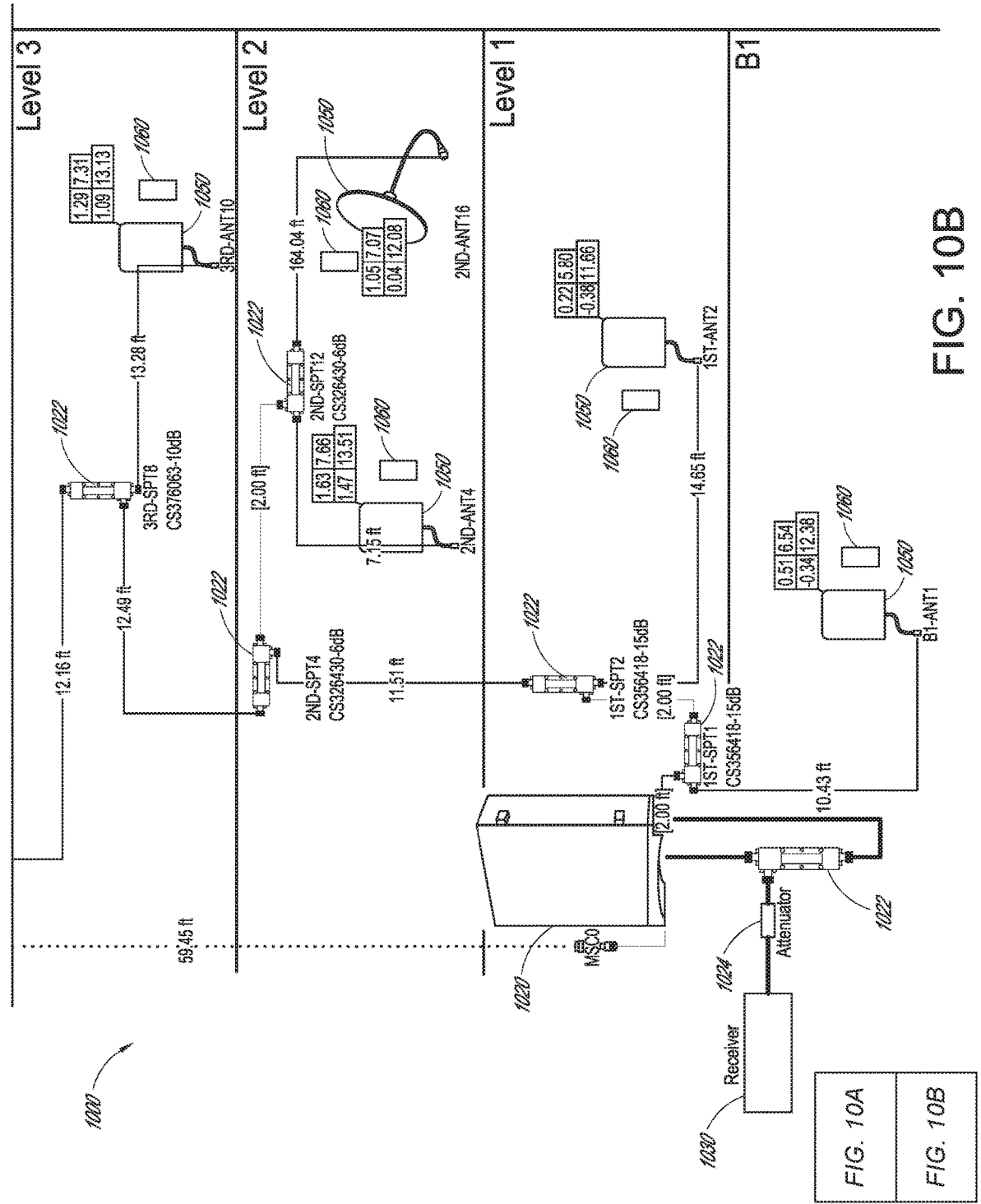

Turning to FIG. 10, which is shown as FIGS. 10A and 10B split over two pages, an example DAS 1000 is shown as a portion of a DAS in a building. The DAS 1000 includes several components similar to those described above, including a donor antenna 1002, couplers 1022, antennas 1050, transmitters 1060, a BDA 1020, an attenuator 1024, and a receiver 1030.

The DAS 1000 shown can represent a full DAS in a building or one subset of a DAS in an actual building. For instance, the DAS 1000 can be part of a larger DAS separated into two or more separate DAS's that cover different areas of the building. One area serviced by one subset of the DAS (or sub-DAS) can include, for example, the stairwells, while another area serviced by another sub-DAS can include the remaining portions of the floors. Covering the stairwells with a separate sub-DAS can provide backup functionality for first responders in the stairwell, which can be an important point of access for first responders to a building. When multiple sub-DASs are used as part of a DAS, each sub-DAS can have each of the components shown or some subset or superset thereof, including a separate donor antenna.

Additional Embodiments

The features of using a transmitter to monitor an antenna can be implemented in contexts other than a DAS. For instance, in a cellular network, a transmitter may be placed next to any antenna to monitor that antenna. Signals received from the transmitter by the antenna may be provided to a processor, either at the antenna or remote from the antenna. The processor can determine whether a signal is received or whether a signal of sufficiently high level is received. If not, the processor can output an indication that the antenna or an associated component in communication with the antenna (such as a coupler or cable) may not be functioning properly. More generally, a transmitter can be placed in proximity with any antenna to monitor the functionality of that antenna, including antennas used in radar or other applications.

The transmitter may also include software or firmware installed thereon, which may have a variety of possible different functions. The software or firmware may have a networking functionality (such as a network interface implementing the TCP/IP stack) that enables remote communication with the transmitter. Each transmitter may be wired or wirelessly connected to a remote system. A remote server, for instance, can provide administrator devices with network access to the transmitters. The remote server may deliver a web page or other graphical user interface to an administrative device, which user interface can enable an administer to remotely monitor a health of a transmitter (260) and/or its associated antenna (250). Remotely monitoring a transmitter and/or antenna may reduce the need for maintenance personnel to personally inspect transmitters and antennas.

Each transmitter may have a dynamic or static IP address, which can enable network communication with the transmitter. The user interface may indicate whether a transmitter has frozen or otherwise locked up. The user interface may provide an option for a user to select to restart a transmitter that has frozen or for any other reason. Upon user selection of this option, the remote server can transmit a command to the transmitter to power cycle or otherwise restart operation. In response, a hardware processor in the transmitter can perform a power cycle operation. The user interface may also output that a transmitter/antenna pair is no longer functioning in some way. By providing a remote power cycle option, the user interface may allow a user to determine whether the antenna or the transmitter is failing. If the transmitter/antenna pair continues to appear to not be functioning in the user interface, even after a power cycle, then the antenna or transmitter may have failed.

In another example, the receiver is network-enabled, and the remote server can communicate with the receiver to obtain the same information described above (for example, regarding component failures) instead of communicating individually with the transmitters.

Terminology

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Unless the context clearly requires otherwise, throughout the description and the claims, the words "comprise," "comprising," "include," "including," "having," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or" in reference to a list of two or more items, covers all of the following interpretations of the word: any one of the items in the list, all of the items in the list, and any combination of the items in the list. Likewise the term "and/or" in reference to a list of two or more items, covers all of the following interpretations of the word: any one of the items in the list, all of the items in the list, and any combination of the items in the list.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount.

Depending on the embodiment, certain operations, acts, events, or functions of any of the algorithms described herein can be performed in a different sequence, can be added, merged, or left out altogether (e.g., not all are necessary for the practice of the algorithms). Moreover, in certain embodiments, operations, acts, functions, or events can be performed concurrently, e.g., through multi-threaded processing, interrupt processing, or multiple processors or processor cores or on other parallel architectures, rather than sequentially.

These and other changes can be made to the inventions in light of the above Detailed Description. While the above description describes certain examples of the inventions disclosed herein, and describes the best mode contemplated, no matter how detailed the above appears in text, the inventions can be practiced in many ways. Details of the system may vary considerably in its specific implementation, while still being encompassed by the inventions disclosed herein. As noted above, particular terminology used when describing certain features or aspects of the inventions should not be taken to imply that the terminology is being redefined herein to be restricted to any specific characteristics, features, or aspects of the inventions with which that terminology is associated.

Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application, in either this application or in a continuing application.

What is claimed is:

1. An antenna monitoring system comprising:
a plurality of transmitters, each of the transmitters configured to be located in proximity to an antenna of a plurality of antennas, the plurality of transmitters configured to transmit a first plurality of signals to the plurality of antennas on a plurality of channels, each transmitter of the plurality of transmitters configured to transmit a signal of the first plurality of signals on a particular channel of the plurality of channels; and
a receiver configured to be connected over a first wired connection to a coupler, the coupler connected to the plurality of antennas over a second wired connection, the receiver comprising hardware circuitry configured to:
receive over the first and second wired connections a second plurality of signals from the plurality of antennas, the second plurality of signals transmitted in response to the transmission of the first plurality of signals;
in response to not receiving a signal associated with a channel of the plurality of channels, determine that no second signal has been received from an antenna of the plurality of antennas associated with a transmitter configured to transmit a signal of the first plurality of signals on the channel; and
in response to the determination, output an indication of a failure of the antenna.

2. The system of claim 1, wherein the second plurality of signals are configured to be at least one of attenuated or limited before being received by the hardware circuitry.

3. The system of claim 1, wherein at least one of the transmitters is configured to be mechanically attached to one of the antennas.

4. The system of claim 1, wherein each of the transmitters is configured to be placed within receiving range of one of the antennas but not any of the other antennas.

5. The system of claim 1, wherein each of the transmitters comprises a hardware processor and a network interface, the network interface configured to receive instructions from a remote computer system over a network.

6. The system of claim 5, wherein the transmitters are configured to receive a power cycle instruction to cause the transmitters to restart.

7. The system of claim 1, wherein the circuitry is further configured to output the indication of the failure to at least one of a display, a fire alarm control unit, an annunciator panel, or a remote computing system.

8. The system of claim 1, wherein the system is configured to monitor at least one of cellular communications or emergency communications.

9. The system of claim 1, wherein each of the transmitters is configured to transmit within a range of about 1 to 2 meters, such that each of the transmitters is within about 1 to 2 meters of one of the antennas.

10. The system of claim 1, further comprising the plurality of antennas and the coupler.

11. The system of claim 1, further comprising an attenuator configured to:
receive over the first and second wired connections a third plurality of signals from the plurality of antennas;
transform at least one signal of the third plurality of signals into a modified signal by at least one of attenuating or limiting level of the at least one signal to satisfy a signal level threshold of the receiver; and
provide to the receiver as the second plurality of signals the third plurality of signals including the modified signal.

12. An antenna monitoring method comprising:
under control of hardware circuitry of a receiver connected to a plurality of antennas over a wired connection:
receiving over the wired connection a plurality of signals from the plurality of antennas, the plurality of signals being transmitted in response to another plurality of signals transmitted to the plurality of antennas from a plurality of transmitters monitoring the plurality of antennas, the plurality of transmitters transmitting the another plurality of signals on a plurality of channels, each of the channels of the plurality of channels associated with only one transmitter of the plurality of transmitters;
determining that no signal has been received from at least one antenna in response to determining that no signal has been received on a channel associated with a transmitter monitoring the at least one antenna; and
outputting an indication of a failure corresponding to the at least one antenna.

13. The method of claim 12, further comprising outputting the indication of the failure to at least one of a display, a fire alarm control unit, an annunciator panel, or a remote computing system.

14. The method of claim 12, wherein each of the transmitters is located in proximity to one of the antennas.

15. An antenna monitoring system comprising:
a plurality of transmitters configured to be located in proximity to a plurality of antennas and to transmit a first plurality of signals on a plurality of channels, each transmitter of the plurality of transmitters configured to transmit a signal of the first plurality of signals on a particular channel of the plurality of channels; and
a receiver comprising hardware circuitry configured to:
receive a second plurality of signals from the plurality of antennas, the second plurality of signals transmitted by the plurality of antennas in response to the first plurality of signals being transmitted to the antennas by the plurality of transmitters;
in response to not receiving a signal associated with a channel of the plurality of channels, determine that no signal has been received from at least one antenna of the plurality of antennas, the at least one antenna associated with a transmitter to which the channel is assigned; and
in response to the determination, output an indication corresponding to a failure of the at least one antenna.

16. The system of claim 15, wherein each of the transmitters is configured to transmit a signal of the first plurality of signals to a corresponding antenna located in the proximity to the transmitter.

17. The system of claim 15, wherein the circuitry is configured to be connected to the plurality of antennas over a wired connection, and wherein the circuitry is configured to receive the second plurality of signals over the wired connection.

18. The system of claim 15, wherein the circuitry is further configured to output the indication corresponding to the failure to at least one of a display, a fire alarm control unit, an annunciator panel, or a remote computing system.

19. An antenna monitoring system comprising hardware circuitry configured to:
  receive a first plurality of signals from a plurality of antennas, the first plurality of signals transmitted by the plurality of antennas in response to a second plurality of signals being transmitted to the antennas on a plurality of channels by a plurality of transmitters located in proximity to the plurality of antennas, each transmitter of the plurality of transmitters configured to transmit a signal of the second plurality of signals on a particular channel of the plurality of channels;
  in response to not receiving a signal associated with a channel of the plurality of channels, determine that no signal has been received from at least one antenna of the plurality of antennas associated with a transmitter to which the channel is assigned; and
  in response to the determination, output an indication corresponding to a failure of the at least one antenna.

20. The system of claim 19, wherein each of the transmitters is configured to transmit a signal of the plurality of signals to a corresponding antenna located in proximity to the transmitter.

21. The system of claim 19, wherein the circuitry is configured to be connected to the plurality of antennas over a wired connection.

22. The system of claim 19, wherein the circuitry is further configured to output the indication corresponding to the failure to at least one of a display, a fire alarm control unit, an annunciator panel, or a remote computing system.

* * * * *

UNITED STATES PATENT AND TRADEMARK OFFICE
CERTIFICATE OF CORRECTION

PATENT NO. : 10,594,412 B2
APPLICATION NO. : 16/408921
DATED : March 17, 2020
INVENTOR(S) : Frederick Daniel Leaf et al.

Page 1 of 1

It is certified that error appears in the above-identified patent and that said Letters Patent is hereby corrected as shown below:

In the Claims

In Column 14, Line 12 (Approx.), Claim 20, delete "plurality" and insert --second plurality--.

Signed and Sealed this
Ninth Day of June, 2020

Andrei Iancu
*Director of the United States Patent and Trademark Office*